United States Patent [19]

Hager et al.

[11] 3,725,135

[45] Apr. 3, 1973

[54] PROCESS FOR PREPARING EPITAXIAL LAYERS OF $HG_{1-x}CD_xTE$

[75] Inventors: Robert J. Hager; Maurice L. Hitchell, both of Minneapolis; Obert N. Tufte, Hopkins, all of Minn.

[73] Assignee: Honeywell Inc., Minneapolis, Minn.

[22] Filed: Oct. 9, 1968

[21] Appl. No.: 766,260

[52] U.S. Cl. ....................148/1.5, 148/175, 148/189, 252/62.3 ZT

[51] Int. Cl. ....................H01l 3/20

[58] Field of Search....................148/175, 178, 189, 1.5; 252/62.3 ZT

[56] References Cited

UNITED STATES PATENTS

| | | | |
|---|---|---|---|
| 3,341,374 | 9/1967 | Sirtl | 148/175 |
| 3,386,866 | 6/1968 | Ebert | 148/175 |
| 3,406,048 | 10/1968 | Immendorfer | 148/175 |
| 3,514,347 | 5/1970 | Fumeron et al. | 148/1.5 |
| 3,619,283 | 11/1971 | Carpenter et al. | 252/62.3 |
| 3,622,399 | 11/1971 | Johnson | 252/62.3 |

*Primary Examiner*—Carl D. Quarforth
*Assistant Examiner*—B. Hunt
*Attorney*—Lamont B. Koontz, Francis A. Sirr and Oliver F. Arrett

[57] ABSTRACT

An isothermal process for preparing epitaxial layers of $Hg_{1-x}$CdbxTe in an excess mercury vapor environment. In a preferred embodiment the process provides layers having a predetermined $x$ value within the $Hg_{1-x}Cd_xTe$ alloy system by the selection of a predetermined mercury vapor pressure during processing.

23 Claims, 11 Drawing Figures

INVENTORS
ROBERT J. HAGER
MAURICE L. HITCHELL
OBERT N. TUFTE

BY [signature]
ATTORNEY

THICKNESS (MICRONS)

*INVENTORS*
ROBERT J. HAGER
MAURICE L. HITCHELL
OBERT N. TUFTE
BY [signature]
ATTORNEY.

INVENTORS
ROBERT J. HAGER
MAURICE L. HITCHELL
OBERT N. TUFTE
BY [signature]
ATTORNEY.

INVENTORS
ROBERT J. HAGER
MAURICE L. HITCHELL
OBERT N. TUFTE
BY [signature]
ATTORNEY.

PROCESS FOR PREPARING EPITAXIAL LAYERS OF $HG_{1-x}CD_xTE$

BACKGROUND OF THE INVENTION

This invention is broadly concerned with an isothermal process for preparing $Hg_{1-x}Cd_xTe$ epitaxial layers. Material having these characteristics is desirable for use in infrared detectors.

The alloys of $Hg_{1-x}Cd_xTe$ are of particular interest in infrared detection because in essence they consist of mixtures of HgTe and CdTe. The interesting feature of the $Hg_{1-x}Cd_xTe$ alloy is its compromise between the zero energy gap of HgTe and the 1.5 e.v. gap of CdTe such that a tailored gap width can be obtained over a predetermined range dependent on the $x$-value to provide a material which is sensitive to a desired radiation wavelength. For example, a gap width of around 0.1 e.v. is needed for an intrinsic 8–14 micron infrared detector. Such detectors are possible with the alloy $Hg_{1-x}$CdbxTe having an $x$-value of approximately 0.2.

The epitaxial growth of $Hg_{1-x}Cd_xTe$ layers of this material suitable for the fabrication of detector arrays is particularly desirable because it is inconvenient, expensive and generally unsatisfactory to fabricate arrays by assembling discrete detector elements. The advantages offered by epitaxial growth are important since epitaxial procedures permit the direct deposition of a single crystal layer onto an insulating substrate so that etching and electrical contacting steps are essentially all that is required to complete the fabrication of a detector array or even single detectors from an epitaxially grown layer. For purposes of this specification an epitaxial layer is defined as a continuous single crystal layer or film grown on a CdTe substrate.

SUMMARY OF THE INVENTION

This invention provides an isothermal process performed under mercury vapor pressure for preparing epitaxial layers of alloys in the $Hg_{1-x}Cd_xTe$ system. In a preferred form, the process of this invention is used to prepare $Hg_{1-x}Cd_xTe$ layers having a controlled $x$-value or surface composition and compositional profile.

The process generally comprises a close spaced technique in which a CdTe substrate and a source of HgTe or $Hg_{1-x}Cd_xTe$ are enclosed adjacent each other in an evacuated container and heated under isothermal conditions to a reaction or transfer temperature. An atmosphere of excess mercury vapor pressure i.e., a mercury vapor pressure over and above that provided by the constituents per se, is maintained in the container during the processing. The excess mercury vapor pressure is an important feature of the process for at least two reasons which are discussed in detail below. The source material is transported to the substrate under isothermal conditions due to the difference in chemical potential between the source and substrate. The alloy $Hg_{1-x}$CdbxTe is formed by the interdiffusion of the transported source material and the CdTe substrate.

In accordance with a preferred form of this invention, this process is particularly adapted to provide control over the composition at the surface of the epitaxial layer and the compositional profile within the layer because it has been discovered that composition is a unique function of layer thickness. The growth rate, hence layer thickness, can be controlled by the amount of excess mercury vapor pressure maintained in the system during processing. Consequently, for a given set of conditions (temperature, time and source to substrate spacing) the mercury vapor pressure may be used to control growth rate, hence thickness and therefore ultimately the composition of $x$-value at the surface of the epitaxial layer.

DESCRIPTION OF THE PREFERRED EMBODIMENTS

Figure 1:
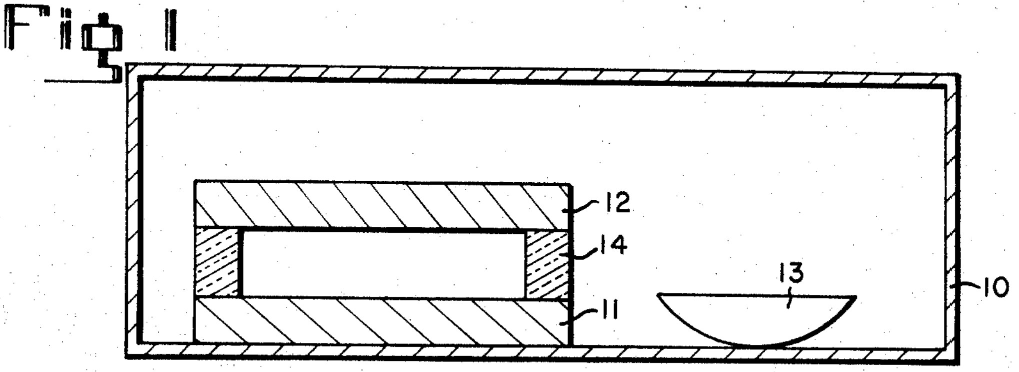
FIGS. 1 and 2 show schematically and in cross-section a system for performing the process.
Figure 2:
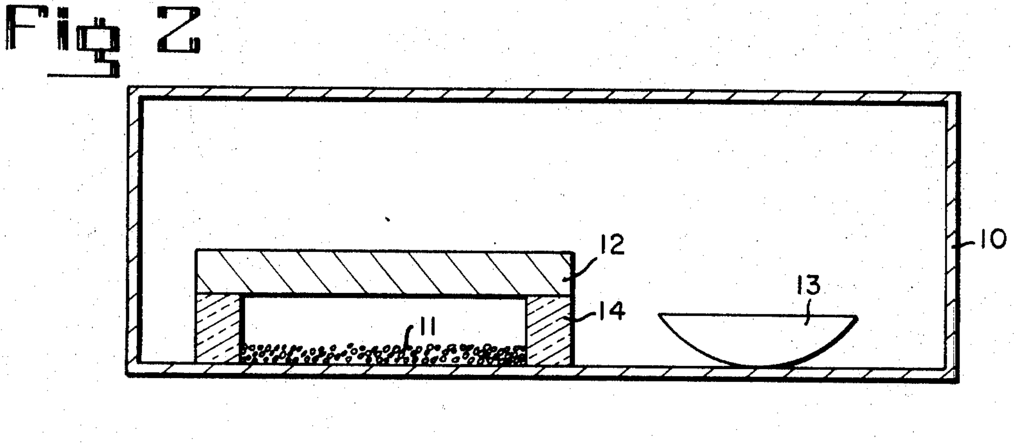

Two schematic system arrangements used for the isothermal close spaced process of epitaxial growth in accordance with this invention are shown in schematic cross-section in FIGS. 1 and 2. A reaction chamber 10 consists of a container, such as quartz, enclosing a source 11, a CdTe substrate 12 and a source of mercury vapor 13, which may be a pool of mercury as shown. Substrate 12 is positioned adjacent and above source 11 and spaced therefrom by a quartz spacer ring 14 which serves to maintain a fixed closely spaced relationship between the source and substrate. Source 11 may be either an alloy of $Hg_{1-x}Cd_xTe$ or HgTe, although HgTe is preferred, particularly in the powder form as shown in FIG. 2. To prepare a source in the powder form, either HgTe of $Hg_{1-x}Cd_xTe$, it may merely be ground up with a mortar and pestle until it reaches a fairly uniform particle size. However, the source may also be in the form of a wafer or other solid body. The additional mercury 13 is included in sufficient quantity to provide an excess mercury vapor pressure over and above that provided by the source and in the range of from about ½ atmosphere up to about 5 atmospheres, as will be discussed hereinbelow. Before heating, chamber 10 is evacuated to a suitable reduced pressure, such as $1 \times 10^{-6}$ Torr, the particular value is not critical. The exact reduced pressure used in any particular circumstance must be suitably low to prevent substantial oxidation of the constituents. Of course, the system must be cooled during evacuation in order to prevent the loss of mercury by evaporation during pump down. Dry ice temperatures are adequate.

Chamber 10 after loading and evacuation is inserted in a furnace and is heated to a temperature sufficient to cause the vapor transport reaction between the source and substrate. A suitable and preferred isothermal reaction temperature has been found to be about 550°–600° C. Under isothermal conditions material from the source is transported primarily to the under side of the substrate where epitaxial growth of a $Hg_{1-x}$CdbxTe alloy occurs due to the interdiffusion between the transferred material and the substrate material. Some growth occurs on all exposed substrate surfaces, but it is minor.

The spacing between the source and substrate must be rather small. The spacing has been varied from about 0.76 mm up to about 15 mm. However, about a 5 to 10 mm spacing is preferred with about 5 mm being most preferred.

The amount of free mercury added to the container should be calculated to provide an excess vapor pressure of from about greater than about one-half atmosphere, preferably greater than about 1 atmosphere, up to about 5 atmospheres, preferably up to about 4 atmospheres, at the reaction temperature selected. The term "excess mercury vapor pressure" as used herein means only the pressure in the container attributable to the extra mercury added thereto and not to mercury originating from the source material.

If a mercury free source of HgTe or $Hg_{1-x}Cd_xTe$ is used, that is a stoichiometric source, and no excess mercury vapor pressure is maintained in the system, surface melting occurs on the source since the surface material must decompose to provide an equilibrium mercury pressure.

Surface melting or partial melting of material on the source causes variations to occur in the evaporation rate of the source during the process resulting in a loss in control over the epitaxial layer formation. When an all solid source is assured during processing a more uniform layer is produced and the vapor pressure can be used as a control of the evaporation rate. Also, with mixed solid-liquid sources, the material tends to "ball up, " that is raised portions form on the source surface which affect the uniform distance between the source surface and the substrate. For close source to substrate spacings, the growth rate depends critically on the spacing and therefore non-uniformities in the layer thickness will result.

The addition of enough excess mercury to the container to provide a mercury vapor pressure within the defined pressure and temperature ranges has been found to completely eliminate surface melting on the source and the formation of the second phase material. Under this condition the source is very clean after an epitaxial deposition and the surface of the source appears to be preferentially etched, i.e., the material removed from the source comes preferentially from certain crystallographic planes. The decomposition takes place predominantly on [111] crystallographic planes. The dependence of decomposition rate of the source on crystallographic direction suggests that powdered sources be used in preference to ingot sources since the surface of the latter usually contain randomly oriented crystallites which evaporate unevenly. At the preferred 550°–600° C range the epitaxial growth rate and quality do not depend on the single crystal orientation of the substrate. It is therefore not necessary to use oriented CdTe substrates although they must be single crystal. It is only at temperatures below about 550° C, for example at about 300° to 400° C, that the crystal orientation of the single crystal CdTe substrate becomes important for good epitaxial results. The examples in the table produced uniform epitaxial layers of $Hg_{1-x}Cd_xTe$ where the surface value of $x$ varied over the range from nearly zero to 0.37 depending on the set of conditions.

TABLE

| Source | spacing | Temp | Hg Press. | Time | X |
|---|---|---|---|---|---|
| HgTe powder | 5 mm | 600°C | 3 atmos. | 88 hrs. | 0.20 |
| HgTe powder | 5 mm | 600°C | 3 atmos. | 41 hrs. | 0.21 |
| HgTe powder | 5 mm | 600°C | 3 atmos. | 176 hrs. | 0.21 |
| HgTe powder | 5 mm | 600°C | 4.2 atmos. | 88 hrs. | 0.25 |
| HgTe powder | 5 mm | 600°C | 1 atmos. | 88 hrs. | 0.08 |
| HgTe wafer | 0.82 mm | 600°C | 4.2 atmos. | 24 hrs. | 0.21 |
| HgTe wafer | 0.82 mm | 600°C | 2.5 atmos. | 24 hrs. | 0.09 |
| HgTe wafer | 0.82 mm | 600°C | 1.25 atmos. | 24 hrs. | 0.035 |
| HgTe wafer | 0.76 mm | 600°C | 0.5 atmos. | 24 hrs. | 0.04 |
| HgTe wafer | 0.76 mm | 600°C | 1 atmos. | 24 hrs. | 0.05 |
| HgTe wafer | 0.76 mm | 600°C | 1.5 atmos. | 24 hrs. | 0.06 |
| HgTe wafer | 0.76 mm | 600°C | 2.5 atmos. | 24 hrs. | 0.11 |
| HgTe wafer | 0.76 mm | 600°C | 3.5 atmos. | 24 hrs. | 0.14 |
| $Hg_{0.8}Cd_{0.2}Te$ | 5mm | 600°C | 3 atmos. | 88 hrs. | 0.37 |
| $Hg_{0.86}Cd_{0.14}Te$ | 5mm | 600°C | 3 atmos. | 88 hrs. | 0.27 |

REPRODUCIBILITY AND CONTROL OVER X-VALUE

For a given set of conditions (time, temperature and source to substrate spacing), the thickness of the epitaxial layer and consequently the composition of the material at the surface of the layer can be varied by means of the excess mercury vapor pressure which is maintained in the system. The pressure is preferably provided by adding a relatively small amount of free mercury to container 10 during loading. The necessary quantity of free mercury needed to provide a vapor pressure within the range previously defined is determined by the volume of the container and the mercury vapor pressure desired at the selected reaction temperature. After the epitaxial deposition, at least 90 percent of the excess mercury can be recovered, which indicates that the mercury acts primarily as a control of the source material (HgTe or $Hg_{1-x}Cd_xTe$) transport rate and does not become incorporated into the epitaxial layer.

Figure 3:
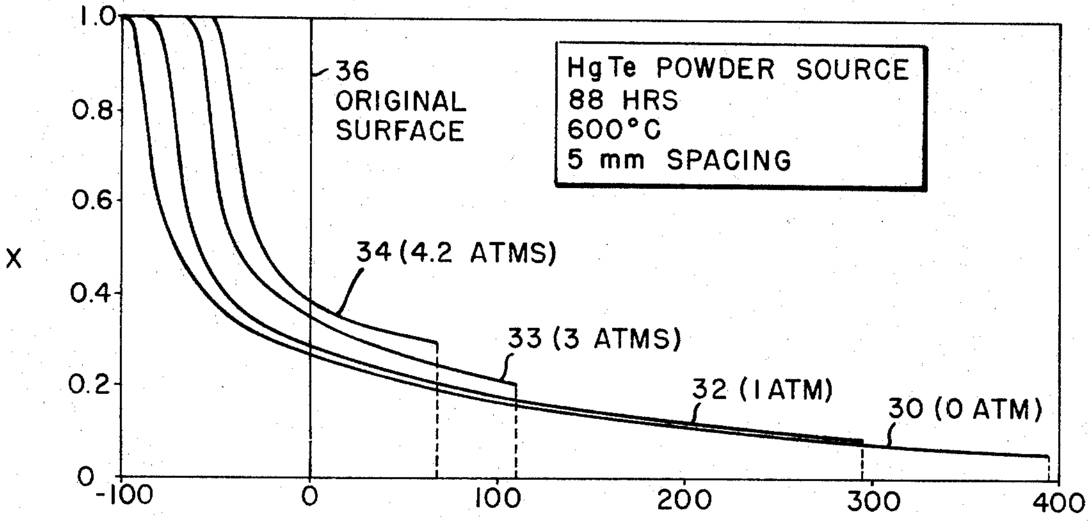
FIG. 3 is a graph showing the compositional profiles of four epitaxial layers grown under identical conditions except for the amount of additional mercury or excess mercury vapor pressure.

The compositional profiles of four layers grown with different mercury pressures are shown in FIG. 3. The four layers were grown for 88 hours at a temperature of 600° C with a source to substrate spacing of 5 mm. Curve 31 represents a layer grown at a zero atmosphere mercury vapor pressure level; curve 32 represents a layer grown at 1 atmosphere; curve 33 represents a layer grown at 3 atmospheres and curve 34 represents a layer grown at 4.2 atmospheres. The source material was was HgTe powder. The original substrate surface is indicated as 36.

Figure 4:
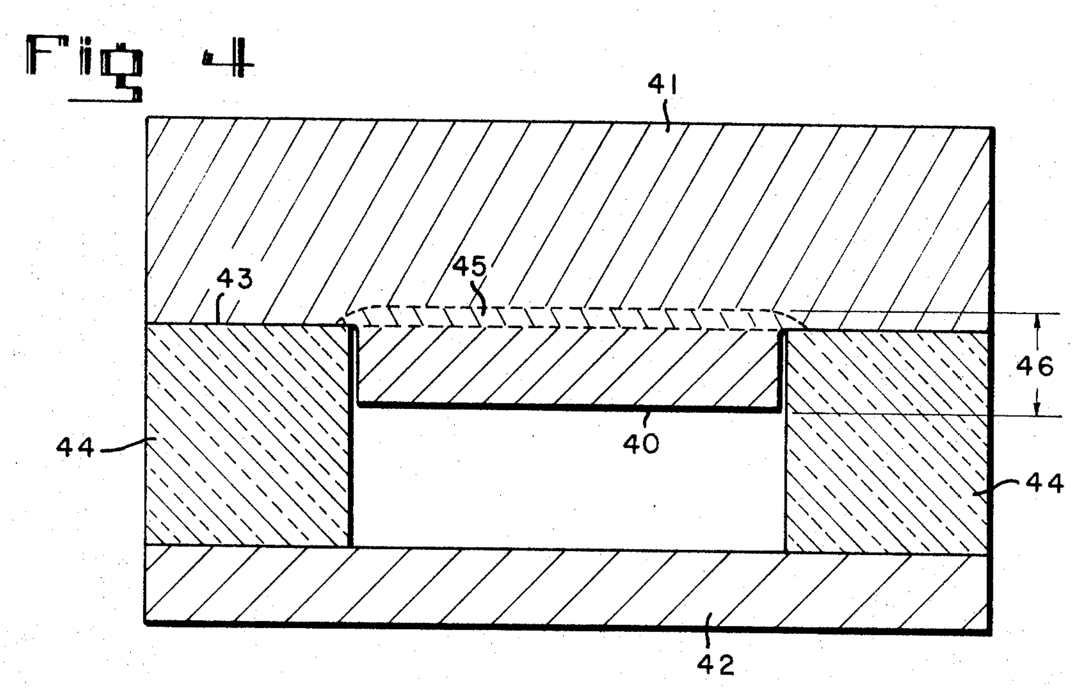
FIG. 4 is a schematic representation of an actual photomicrograph of an epitaxial layer showing the masking effect of the quartz spacer ring and consequently the approximate position of the original surface of the CdTe substrate.

As can be seen from FIG. 3, if no excess mercury is added to the system, the growth rate is sufficiently rapid that the compositional profile is very nearly identical to that obtained by the interdiffusion of bulk samples of HgTe and CdTe as described by F. Bailly, G. Cohen-Solal and Y. Marfaing, *Comptes Rendus* 257 103 (1965). With increasing mercury pressure, the growth rate is reduced to the point that the boundary at the surface of the epitaxial layer affects the compositional profile and results in an increase in the $x$-value at the original surface. The position of the original substrate surface plane 36 in FIG. 3 was calculated from the compositional profiles since the original surface is not detectable in the epitaxial layer. A metallographic cross-section of an epitaxial layer 40 prepared on a CdTe substrate 41 from a HgTe source 42 is schematically shown in FIG. 4. This photomicrograph facsimile shows the edge 43 where the quartz spacer ring 44 contacts the surface of the CdTe substrate 41. The quartz spacer 44 masks the local deposition at the point of contact 43 and therefore marks the approximate position of the original surface of the CdTe substrate 41. In preparing actual photomicrographs, the CdTe layer 41 has been stained with a special solution described hereinbelow which makes the CdTe appear black. The effective out-diffusion of the CdTe, indicated as area 45, is clear in the actual photomicrographs.

Figure 5:
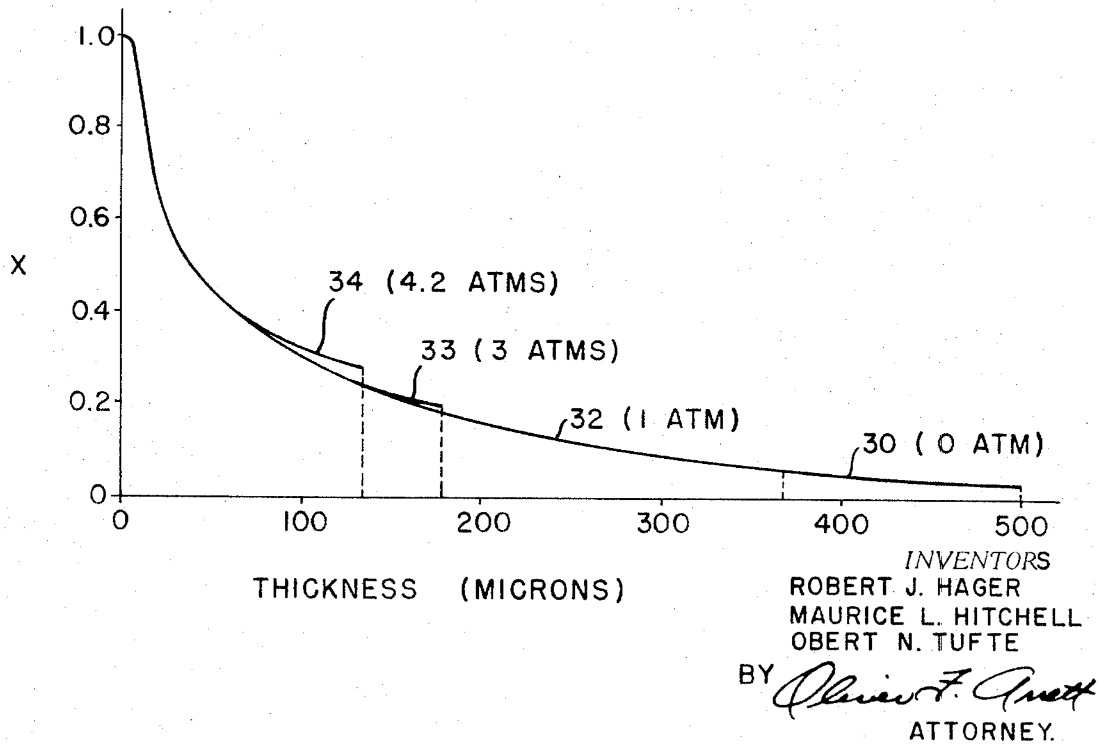
FIG. 5 is a graph showing the compositional profile curves of the four layers shown in FIGS. 3 after replotting to normalize the curves to the CdTe edge of the epitaxial layer.
Figures 6, 7:
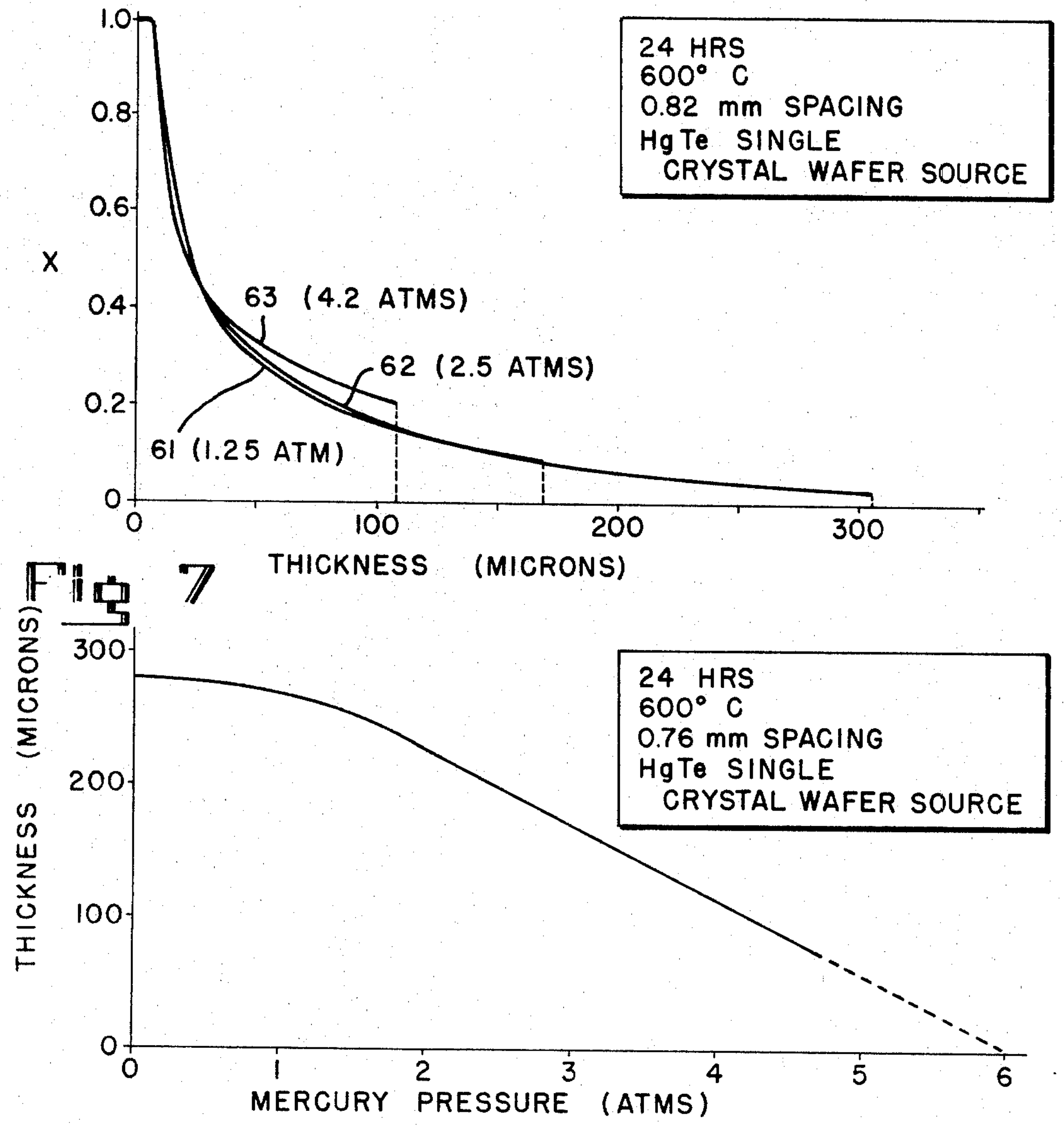
FIG. 6 is a graph showing the compositional profile curves of three epitaxial layers grown for 24 hours but under different mercury vapor pressures.
FIG. 7 is a graph showing the dependence of the layer thickness on mercury vapor pressure for layers grown with a spacing of 0.76 mm at 600° C for 24 hours.

In studies of the properties of these epitaxial layers, the position of the original surface is not significant since the effective thickness of the layer includes the portion of the CdTe substrate that has out-diffused as well as the material transported from the HgTe source. For the purposes of this specification the thickness of the epitaxial layer 46 is defined as the distance from the pure CdTe in the substrate to the outer or exterior surface of the epitaxial layer as indicated in FIG. 4 and includes the out-diffused portion 45. The compositional profile curves in FIG. 3 replotted in FIG. 5 to show the profile relative to the pure CdTe boundary of the epitaxial layer. When plotted in this manner, it is clear that the compositional profile relative to the CdTe boundary is very nearly the same for all the layers i.e., the compositional profile depends only on the time and temperature of the deposition. Similar data for a different deposition time and source to substrate spacing is shown in FIG. 6. The thinnest layers show a slight deviation near the surface due to the presence of the boundary.

The invariance of the compositional profile curves is a significant feature of this invention since the composition at the surface of the epitaxial layer is directly related to the thickness of the layer. The mercury vapor pressure acts as an agent for controlling the growth rate and layer thickness. In addition, it prohibits surface melting on the source thereby allowing evaporative control to be maintained over the source as discussed herein above. In short, the problem of compositional control is a problem of thickness control. Furthermore, the uniformity in the composition over the surface of the layer is related to the uniformity in thickness of the layer.

The dependence of the layer thickness on mercury pressure for layers grown 24 hours at 600° C with a source to substrate spacing of 0.82 millimeters is shown in FIG. 6. Curve 61 represents a layer grown at a 1.25 atmosphere mercury vapor pressure, curve 62 a layer grown at 2.5 atmospheres and curve 63 a layer grown at 4.2 atmospheres. The source material was a HgTe wafer. Under these conditions, the composition at the surface of the layer can be varied from $x \cong 0.05$ to 0.2 by varying the excess mercury pressure from just greater than 0 up to about 4.2 atmospheres. For 88 hour runs, with a separation of 5 millimeters, the surface composition was varied from 0.08 to 0.4. In each case, the surface composition is determined by the layer thickness and as shown by FIG. 7, layer thickness is a function of mercury vapor pressure. The layers prepared for FIG. 7 were grown at a temperature of 600° C for 24 hours with a source to substrate spacing of 0.76 mm. The sources were HgTe wafers.

The source to substrate spacing also affects the deposition rate of HgTe and consequently the layer thickness. For the larger spacings (greater than 2 millimeters) the layer thickness is also a slowly varying function of the spacing. For example, for the deposition conditions given in FIG. 3 and a mercury vapor pressure of 3 atmospheres, the surface composition changed from $x = 0.2$ to $x = 0.24$ when the spacing was changed from 5 millimeters to 15 millimeters. For close spacings (less than about 1 millimeter), the layer thickness varies much more rapidly with spacing as discussed by Cohen-Solal et al., *Rev. Phys. Appl.* 1, 11 (1966).

The following conditions relate to several epitaxial layers having a surface composition of $x \cong 0.2$ which have been grown by this isothermal process. The conditions represent those which are preferred for preparing epitaxial $Hg_{1-x}Cd_xTe$ with an $x$ value $\cong 0.2$ in accordance with this invention.

Source to substrate spacing — about 5 millimeters
Temperature — 600° C
Hg Pressure — 3 atmospheres
HgTe powder source material
Layer thickness — 170 microns
Time — 88 hours Variations of 5 to 10 microns in layer thickness between identical runs are to be expected and occasionally larger deviations occur. However, composition control with such thickness deviations is satisfactory.

Generally speaking, reproducibility and compositional or $x$-value control may be provided by this process because the thickness of the epitaxial layers which are prepared can be varied is demonstrated herein above by varying the mercury vapor pressure within the reaction enclosure for any given set of growth conditions (time, temperature and source to substrate spacing). An increase in the mercury pressure results in a decrease in the layer thickness. However, if the thickness of several layers is varied by applying various differing mercury pressures during their growth but with the same other growth conditions the compositional profile within the layers remains fixed, i.e., for example, the compositional profile within a layer 100 microns thick is substantially identical to the compositional profile within the initial 100 microns of a much thicker layer grown at a lower mercury vapor pressure but with the same conditions of time, temperature and source to substrate spacing. Thus, the composition at the surface of the epitaxial layer is determined by the layer thickness which can be controlled by mercury vapor pressure. Consequently, compositional control may be established by growing layers to predetermined thickness. However, direct control over thickness is difficult. Consequently, other procedures are preferably used.

Figure 8:
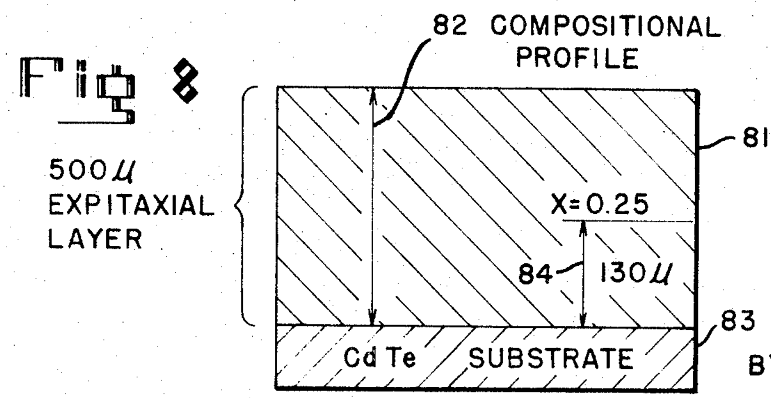
FIG. 8 is a schematic showing of an epitaxial layer prepared according to this invention.

For example, an epitaxial layer may be grown under a given set of conditions, such as temperature of 600° C, a spacing of 5 mm, a mercury vapor pressure of one-half atmosphere and for a time of 88 hours. The resultant layer 81 is approximately 500 microns thick as schematically shown in FIG. 8 and has a fixed compositional profile 82 perpendicular to the direction in which it was grown, the profile decreasing in $x$-value with thickness (measured from the CdTe substrate 83 as defined in connection with FIG. 4). Using this thick layer 81 as a control, layers having a desired $x$-value selected from the compositional profile of the control may be prepared under the same conditions of time, temperature and spacing by experimentally determining which particular increased mercury vapor pressure at the same conditions will provide the desired $x$-value.

More specifically, an $x$-value of 0.25 may be desired. Using the control layer of FIG. 8 for illustration, it is determined that the $x$-value = 0.25 composition is located at a distance of 130 microns from the substrate as indicated at 84 in the figure.

Having determined that an epitaxial layer 130 microns thick (grown under the same conditions of time, temperature and spacing) will have the desired $x$ = 0.25 composition, the remaining parameter of mercury vapor pressure must be selected. The objective is to determine exactly which mercury vapor pressure must be used at the control conditions to provide a 130 micron thick layer. This may be accomplished experimentally by growing several layers at selected pressures. Using this approach it would be determined that a mercury vapor pressure of about 4 atmospheres produces a the 130 micron thick epitaxial layer at the $x$ = 0.25 composition level and at the control conditions of time, temperature and spacing described above. It will be obvious to those having ordinary skill in this art that a wide variety of conditions may be used to prepare control layers and that a wide variety of conditions are consequently available for preparing epitaxial layers having $x$-values over a wide range.

As an indication of the effectiveness of this invention with regard to control, it was experimentally determined (for growth periods of 88 hours and 5 mm spacing) that the epitaxial layers produced according to a control layer were, with respect to $x$-value, identical to the selected control composition when mercury vapor pressures of from about 1 to about 2 atmospheres were used; were correct to within about 2 mole percent when mercury vapor pressures of from about 3 up to about 4 atmospheres were used, and were correct to about 5 mole percent when mercury vapor pressures of about 4 up to about 5 atmospheres were used. Above 5 atmospheres the control over compositional similarity was considered to be unsatisfactory. For other growth periods, spacings and the like, this effect will be generally the same.

$Hg_{1-x}Cd_xTe$ SOURCES

The isothermal process of epitaxial growth has also been accomplished using alloys of $Hg_{1-x}Cd_xTe$ as the source material and CdTe as the substrate. The transport mechanism for this epitaxial growth process is identical to that which occurs when HgTe is used as the source and CdTe is used as the substrate.

Figures 9, 10, 11:
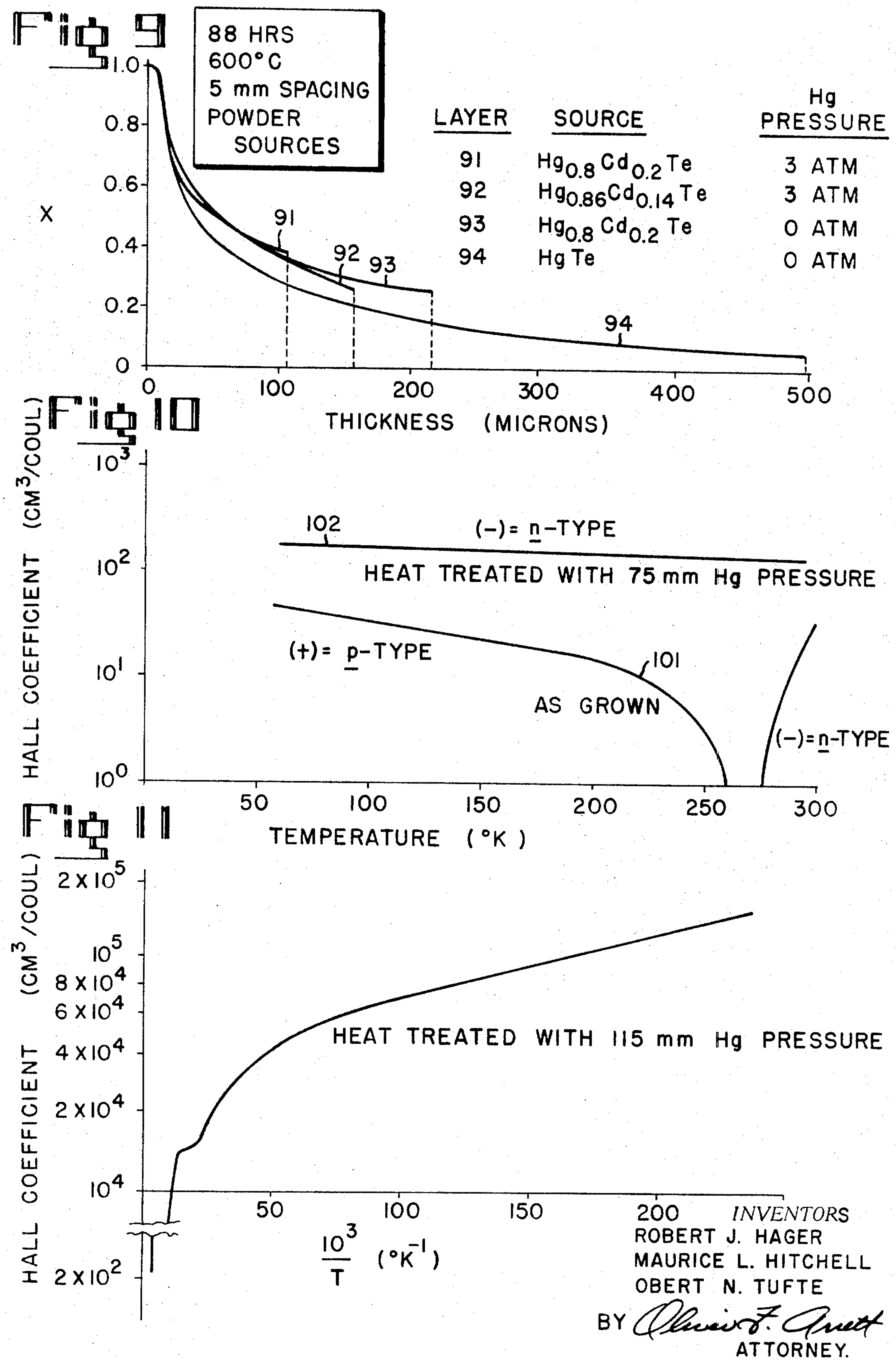
FIG. 9 is a graph showing the compositional profile curves for three epitaxial layers grown from $Hg_{1-x}Cd_x$ Te alloy sources; the profile curve for a layer grown under the same conditions but with a HgTe source is also shown for comparison.
FIG. 10 is a graph showing the conductivity type as measured by the Hall coefficient for a typical epitaxial layer in the "as grown" state and after heat treatment at 300° C at a mercury vapor pressure of 0.1 atmosphere.
FIG. 11 is a graph showing the free electron concentration as measured with the Hall coefficient in a heat treated epitaxial layer.

As examples, several epitaxial layers have been grown from $Hg_{1-x}Cd_xTe$ source material at a temperature of 600° C for 88 hours with a spacing of 5 mm. The compositional profiles of these layers along with a replot of the standard profile curve obtained under these conditions with a HgTe source are shown in FIG. 9. Curve 91 represents a layer grown at a mercury vapor pressure level of 3 atmospheres from a $Hg_{0.8}Cd_{0.2}e$ powder source; curve 92 represents a layer grown at a mercury vapor pressure level of 3 atmospheres from a $Hg_{0.86}Cd_{0.14}Te$ powder source; curve 93 represents a layer grown at a zero mercury vapor pressure level from a $Hg_{0.8}Cd_{0.2}Te$ powder source, and curve 94 represents a layer grown at a zero mercury vapor pressure level from a HgTe powder source. These results clearly indicate that cadmium is being transported from the source to the substrate since in the absence of such transport, the profile curves should be coincident with the HgTe source curve. The similarity of the profile curves for layers grown with $Hg_{1-x}Cd_xTe$ suggests that approximately the same amount of cadmium is being transported in each case. The presence of cadmium in the source tends to decrease the growth rate of the epitaxial layers. Also, the transport rate is decreased with increasing mercury pressure as with the HgTe sources. However, the alloy sources usually contain small mercury occlusions so that an indeterminate amount of additional free mercury is present in the system. This makes the control of the mercury pressure and hence control of the growth rate more complicated. Consequently, HgTe sources are preferred over $Hg_{1-x}Cd_xTe$ sources in practicing this invention.

HEAT TREATMENT

The conductivity type and the free carrier concentrations of the epitaxial layers after growth can be significantly altered or adjusted by post growth heat treatment if desired. For example, heat treatment for 48 hours at 300° C in a mercury vapor pressure of approximately 100 millimeters results in $n$-type conductivity and heat treatment at low pressures or in vacuo at 300° C results in $p$-type layers. The effect of heat treatment on the Hall coefficient of a typical $p$-type "as grown" layer (represented by curve 101) having a surface composition of $x \cong 0.2$ is shown in FIG. 10 undergoing a change to $n$-type (represented by curve 102). The Hall coefficient becomes negative and indicates an electron concentration of approximately $4 \times 10^{16} cm^{-3}$. The low temperature electron mobility after heat treatment at a mercury vapor pressure level of 75 mm is approximately $5 \times 10^4 cm^2/V$-sec. A small variation in the mercury vapor pressure during heat treatment generally results in only a small change in the electron concentration. It is therefore possible to convert $p$-type to $n$-type and vice versa with appropriate heat treatment as a last step in the process of this invention if desired.

In addition, heat treatment under mercury vapor pressure has been used to lower the carrier concentration of *n*-type epitaxial layers, a feature which is significant when the material is to be used as a photoconductive detector.

For example, a layer was prepared in 88 hours, at a temperature of 600° C with a source to substrate spacing of 5 mm and a mercury vapor pressure of 3 atmospheres. The layer had a surface composition of $x \times 0.2$ and a free electron concentration of $6 \times 10^{16} cm^{-3}$. After heat treatment at 300° C for 48 hours at a mercury vapor pressure of 115 mm, the free electron concentration decreased to $6 \times 10^{13}$ at 4.2° K. The curve of FIG. 11 shows the Hall coefficient measurements for this layer. The slope of this curve at higher temperatures shows an energy gap of 0.1 eV which is expected for material having $x$=0.2. It is therefore clear that the electrical properties of this layer are dominated by the material near the layer surface.

COMPOSITION UNIFORMITY IN ISOTHERMALLY

GROWN EPITAXIAL LAYERS

With the isothermal close spaced technique, the compositional uniformity is directly related to the uniformity in the thickness of the layers. The epitaxial layers have smooth mirror like surfaces and show no significant thickness variations on either a macroscopic or a microscopic scale. Thickness measurements on a layer 170 microns thick show a maximum deviation of about 2 microns across the diameter of the layer, i.e., over a length of approximately 1 centimeter. Based on the profile curve in FIG. 5, this indicates a compositional variation of approximately 0.25 mole percent.

The compositional uniformity was also investigated with an electron beam microprobe on a 170 micron thick layer having a surface composition $x \cong 0.2$. The composition over the surface area of the epitaxial layer was uniform to the accuracy limit of the microprobe, which was one-half mole percent ($\Delta x = 0.005$). The surface area of the layer was approximately 1 square centimeter. This indicates that the compositional uniformity over the surface of the epitaxial layer meets infrared detector requirements.

A compositional gradient will always be present in a direction perpendicular to the surface of isothermally grown epitaxial layers. The magnitude of this gradient depends on the $x$-value at the surface and the deposition conditions. However, increasing the layer thickness by increasing the deposition time will result in a decrease in the gradient. For layer grown for 88 hours and having a surface composition of $x = 0.2$, the composition will change by about 1.5 mole percent through the 20 microns of material nearest the surface.

MEASUREMENTS OF COMPOSITIONAL PROFILE

The compositional profile within isothermally grown epitaxial layers has been measured by means of an electron beam microprobe. The microprobe is calibrated by means of melt grown standard alloy samples whose composition has been determined by density measurements. The cadmium concentration, which corresponds to $x$ in $Hg_{1-x}Cd_xTe$ is measured with the microprobe and the mercury profile is given by $1-x$. The epitaxial layers are cast in Lucite and sample and Lucite are then lapped to expose a cross-section of the sample that is normal to the surface of the epitaxial layer. The exposed surface is mechanically polished to remove surface roughness. At this point, the epitaxial layer on the CdTe substrate can be visually seen under a microscope. However, the layer can be defined much better by staining the sample cross-section with a solution 1 part $H_2O$, 2 parts $H_2O_2$ and 3 parts HF. The etch defines the epitaxial layer since it attaches and stains only pure CdTe, the stained color of the pure CdTe being black. Microprobe analysis of stained layers shows that the stain stops at precisely the point where the cadmium concentration starts to decrease from its value in CdTe. The compositional profile measurements are made on the sample by traversing the electron beam from the CdTe to the surface of the epitaxial layer. The diameter of the electron beam usually used is about 5 microns. Profiles measured at several intervals along the diameter of the epitaxial layers are always identical, indicating good lateral compositional uniformity.

Having described the invention it will be readily apparent to those familiar with this art that many modifications of it are possible. It should therefore be understood that the invention is not to be limited by the embodiments described but only by the scope of the following claims.

The embodiments of the invention in which an exclusive property or right is claimed are defined as follows:

1. A process for preparing epitaxial layers of $Hg_{1-x}Cd_xTe$ comprising the steps of:

enclosing a source material selected from the group consisting of HgTe and $Hg_{1-x}Cd_xTe$ and a CdTe substrate in an evacuated chamber, heating the source and substrate isothermally to a temperature at which vapor transport of the source material to the substrate occurs while maintaining an excess mercury vapor pressure in the chamber, and maintaining the heating for a period of time sufficient to grow an epitaxial layer of $Hg_{1-x}Cd_xTe$.

2. A process according to claim 1 wherein the excess mercury vapor pressure is provided by enclosing a predetermined quantity of mercury in the chamber with the source and substrate materials.

3. A process according to claim 1 wherein the mercury vapor pressure in the enclosed chamber during heating ranges from a value greater than zero up to about 5 atmospheres.

4. A process according to claim 3 wherein the isothermal temperature is about 550° C to about 600° C.

5. A process according to claim 1 wherein the source is HgTe.

6. A process according to claim 1 wherein the source and substrate are adjacently positioned within 15 mm or less of each other.

7. A process according to claim 1 wherein the epitaxial layer is subsequently subjected to a further heat treatment to adjust its conductivity type or its free carrier concentration.

8. A process according to claim 7 wherein the heat treatment is accomplished in a mercury vapor environment.

9. A process according to claim 7 wherein the heat treatment is accomplished in vacuo.

10. The process according to claim 1 wherein the substrate is adjacently positioned above the source in a closely spaced relationship.

11. A process according to claim 10 wherein the source and substrate are positioned within 15 mm or less of each other.

12. A process according to claim 10 wherein the isothermal temperature is about 550° C to about 600° C.

13. A process according to claim 10 wherein the mercury pressure is greater than about 1 but less than about 4 atmospheres.

14. A process in accordance with claim 10 wherein the source material is HgTe.

15. A process in accordance with claim 14 wherein the HgTe is in the form of a powder.

16. A process according to claim 10 wherein the *x*-value at the surface of the layer is to be about 0.2;

the isothermal temperature is about 600° C;

the spacing between source and substrate is about 5 mm;

the mercury pressure is about 3 atmospheres; and the growth period is about 88 hours.

17. A process according to claim 10 wherein the epitaxial layer is grown to a predetermined thickness.

18. A process according to claim 10 wherein the epitaxial layer is subjected to a further heat treatment to adjust its conductivity type or free carrier concentration.

19. A process according to claim 18 wherein the heat treatment is performed in a mercury vapor environment.

20. A process according to claim 18 wherein the heat treatment is performed in vacuo.

21. A process according to claim 1 wherein the growth conditions of time, temperature and source to substrate spacing used correspond substantially to those previously used for the growth of a control layer whereas the mercury vapor pressure used has a certain predetermined higher value than that used for the control layer whereby an epitaxial layer having a predetermined surface *x*-value is prepared.

22. A process according to claim 21 wherein the mercury vapor pressure has a value greater than about one-half atmosphere and less than about 5 atmospheres.

23. A process according to claim 21 wherein the mercury vapor pressure has a value greater than about 1 atmosphere and less than about 3 atmospheres.

* * * * *